(12) United States Patent
Mori et al.

(10) Patent No.: US 8,716,811 B2
(45) Date of Patent: May 6, 2014

(54) SEMICONDUCTOR DEVICE

(75) Inventors: Hideki Mori, Kanagawa (JP); Chihiro Arai, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 13/410,422

(22) Filed: Mar. 2, 2012

(65) Prior Publication Data

US 2012/0248541 A1 Oct. 4, 2012

(30) Foreign Application Priority Data

Mar. 28, 2011 (JP) ................................ 2011-071044

(51) Int. Cl.
*H01L 29/66* (2006.01)

(52) U.S. Cl.
USPC ........... 257/409; 257/328; 257/335; 257/339; 257/340; 257/341; 257/342; 257/343; 257/368; 257/402

(58) Field of Classification Search
CPC .............. H01L 29/402; H01L 29/7802; H01L 29/7804; H01L 29/7809; H01L 29/7811; H01L 29/7823; H01L 29/7827
USPC ......... 257/368, 328, 335, 339, 340, 341, 342, 257/343, 402, 409
See application file for complete search history.

(56) References Cited

U.S. PATENT DOCUMENTS

| 4,532,534 | A * | 7/1985 | Ford et al. ...................... 257/341 |
| 6,724,042 | B2 * | 4/2004 | Onishi et al. .................. 257/341 |
| 6,972,460 | B2 * | 12/2005 | Aida et al. ..................... 257/341 |
| 7,301,203 | B2 * | 11/2007 | Lee et al. ....................... 257/339 |
| 7,655,981 | B2 * | 2/2010 | Lee et al. ....................... 257/339 |
| 2002/0074596 | A1 * | 6/2002 | Suzuki et al. .................. 257/330 |
| 2002/0167020 | A1 * | 11/2002 | Iwamoto et al. ............... 257/110 |
| 2003/0218220 | A1 * | 11/2003 | Takahashi et al. ............ 257/409 |
| 2005/0073004 | A1 * | 4/2005 | Onda et al. .................... 257/341 |
| 2005/0199905 | A1 * | 9/2005 | Komachi ....................... 257/141 |
| 2005/0280086 | A1 * | 12/2005 | Saito et al. ..................... 257/341 |
| 2006/0049459 | A1 * | 3/2006 | Aida et al. ..................... 257/341 |
| 2007/0040217 | A1 * | 2/2007 | Saito et al. ..................... 257/341 |
| 2009/0302376 | A1 * | 12/2009 | Inoue et al. .................... 257/329 |
| 2010/0123186 | A1 * | 5/2010 | Ohta et al. ..................... 257/329 |
| 2010/0200936 | A1 * | 8/2010 | Saito et al. ..................... 257/409 |
| 2011/0115033 | A1 * | 5/2011 | Tamaki et al. ................. 257/409 |
| 2011/0204469 | A1 * | 8/2011 | Onishi ........................... 257/490 |
| 2012/0032305 | A1 * | 2/2012 | Kitamura ....................... 257/607 |
| 2012/0098064 | A1 * | 4/2012 | Onishi ........................... 257/341 |

FOREIGN PATENT DOCUMENTS

JP  2000-323488  11/2000

* cited by examiner

*Primary Examiner* — Fernando L Toledo
*Assistant Examiner* — Christine C Lau
(74) *Attorney, Agent, or Firm* — Dentons US LLP

(57) ABSTRACT

A semiconductor device includes a first conduction-type semiconductor substrate, a first semiconductor region of a first conduction-type formed on the semiconductor substrate, a second semiconductor region of a second conduction-type formed on a surface of the first semiconductor region, a third semiconductor region of the second conduction-type formed to be separated from the second semiconductor region on the surface of the first semiconductor region, a fourth semiconductor region of the second conduction-type formed to be separated from the second semiconductor region and the third semiconductor region on the surface of the first semiconductor region, and a first electrode connected to the second semiconductor region and the third semiconductor region.

8 Claims, 10 Drawing Sheets

Prior Art FIG. 3A
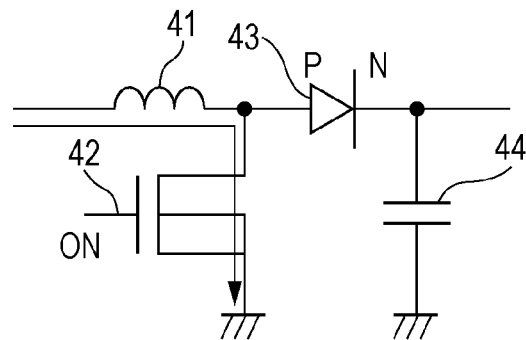
Prior Art FIG. 3B
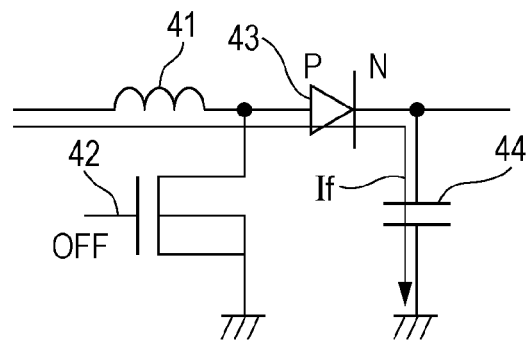
Prior Art FIG. 3C
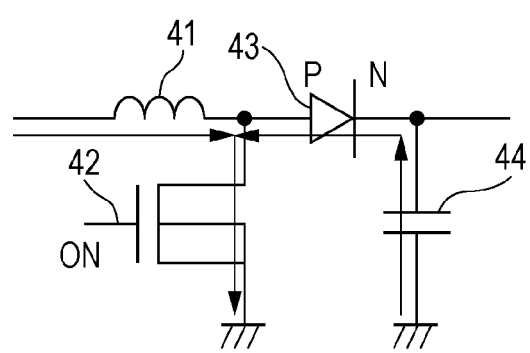

SEMICONDUCTOR DEVICE

BACKGROUND

The present disclosure relates mainly to a power semiconductor device, and more particularly to a semiconductor device that is used as a high-voltage power device.

As high-voltage power devices which are used in high-voltage power electronics applications, vertical PN junction diodes are generally known (for example, see Japanese Unexamined Patent Application Publication No. 2000-323488). Further, vertical DMOSFET (Double-Diffusion Metal-Oxide-Semiconductor Field Effect Transistors) and IGBT (Insulated Gate Bipolar Transistors) are generally known.

SUMMARY

In high-voltage power devices, from the viewpoint of power savings (low loss) and operation, improvement of reverse recovery characteristics, and particularly reverse recovery time (trr) characteristics, is necessary.

Accordingly, it is desirable to provide a semiconductor device having excellent voltage resistance and electrical characteristics.

According to an embodiment of the present disclosure, there is provided a semiconductor device which includes a first conduction-type semiconductor substrate; a first semiconductor region of a first conduction-type formed on the semiconductor substrate; a second semiconductor region of a second conduction-type formed on a surface of the first semiconductor region; a third semiconductor region of the second conduction-type formed to be separated from the second semiconductor region on the surface of the first semiconductor region; and a fourth semiconductor region of the second conduction-type formed to be separated from the second semiconductor region and the third semiconductor region on the surface of the first semiconductor region. Further, the semiconductor device according to an embodiment of the present disclosure includes a first electrode connected to the second semiconductor region and the third semiconductor region.

According to the above-described semiconductor device, the third semiconductor region and the fourth semiconductor region are separately formed on the surface of the first semiconductor region. Further, the first electrode is connected to the second semiconductor region and the third semiconductor region, and no electrode is connected to the fourth semiconductor region. Because of this, when a voltage is applied to the second semiconductor region and the third semiconductor region and carriers flow into the first semiconductor region, no voltage is applied to the fourth semiconductor region and no carrier flows from the fourth semiconductor region to the first semiconductor region. Accordingly, the number of carriers in the first semiconductor region is reduced, and the reverse recovery time (Trr) characteristics are improved.

Further, by means of the third semiconductor region and the fourth semiconductor region, the breakdown voltage of the semiconductor device can be ensured.

According to the present disclosure, a semiconductor having excellent voltage resistance and electrical characteristics can be provided.

BRIEF DESCRIPTION OF THE DRAWINGS

FIGS. 3A to 3C are circuit diagrams of an output stage circuit of a boost converter;

DETAILED DESCRIPTION OF EMBODIMENTS

Figure 1A:
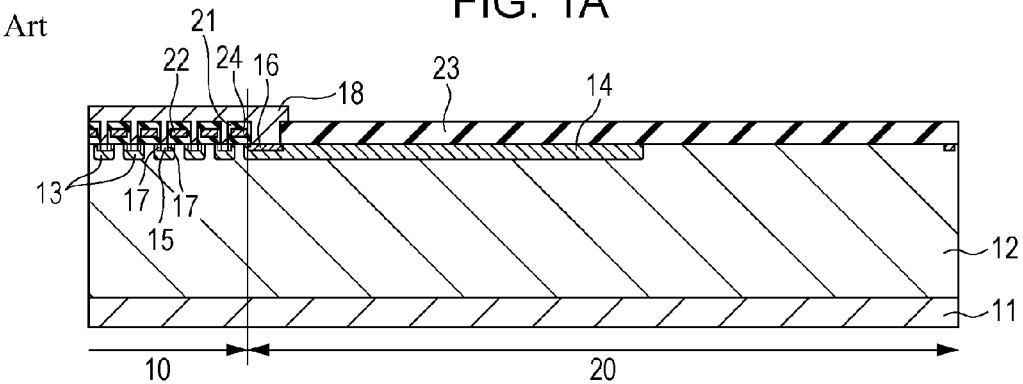
FIG. 1A is a cross-sectional view illustrating the configuration of a vertical DMOSFET.

Hereinafter, examples of a best mode for carrying out the present disclosure will be described, but the present disclosure is not limited to the examples described hereinafter. Further, explanations will be made in the following order.

1. Explanation of a semiconductor device
2. First embodiment of a semiconductor device
3. Modified example of the first embodiment of the semiconductor device
4. Second embodiment of a semiconductor device
5. Modified examples 1 to 3 of the second embodiment of the semiconductor device
6. Operation of the semiconductor device <1. Explanation of a Semiconductor Device>
[Basic Configuration of a Vertical DMOSFET]

A semiconductor device that is applied to a high-voltage power device will be described.

Figure 1B:
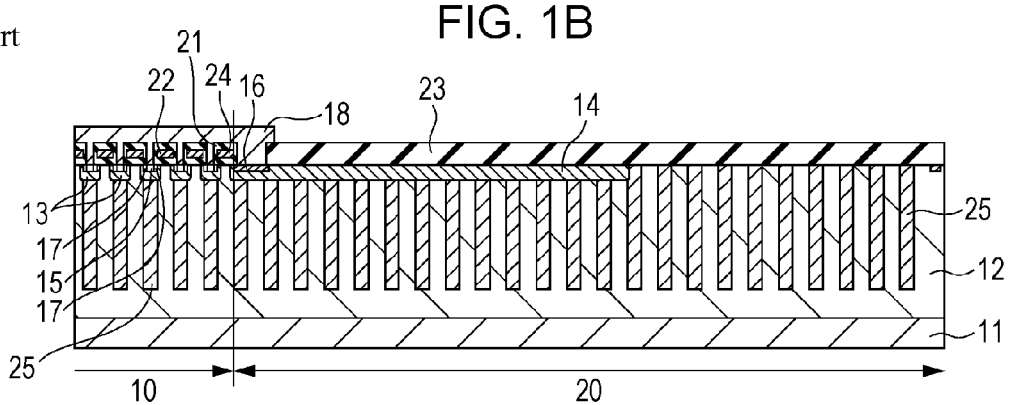
FIG. 1B is a cross-sectional view illustrating the configuration of a vertical DMOSFET having a super junction structure.

FIGS. 1A and 1B are cross-sectional views of a vertical DMOSFET (Double-diffused Metal Oxide Semiconductor Field Effect Transistor) as an example of a high-voltage power device. FIG. 1A is a cross-sectional view illustrating the configuration of a vertical DMOSFET, and FIG. 1B is a cross-sectional view illustrating the configuration of a vertical DMOSFET having a super junction structure.

The vertical DMOSFET illustrated in FIG. 1A includes an active region 10 and a terminal region 20.

The active region 10 is a region in which active elements such as transistors and wires are formed in the vertical DMOSFET. The terminal region 20 is installed on the outer periphery of the active region, and is a region in which no element is formed.

Further, a vertical high-voltage power device, which is represented by the vertical DMOSFET or the like, ensures a high voltage by means of a thickness (depth) of a first conduction-type drift region 12 and impurity concentration. Further, the terminal region 20 that is formed on an outer side of the active region 10 controls a lateral electric field to play an important role so that the breakdown voltage is determined depending on the thickness (depth) of the drift region 12.

According to the vertical DMOSFET illustrated in FIG. 1A, the drift region 12 that is composed of a first conduction-type (n-type) semiconductor region is formed on the main surface of a drain region 11 that is composed of a first conduction-type ($n^+$-type) semiconductor substrate having high impurity concentration.

On the surface of the drift region 12, a body region 13, which is composed of a second conduction-type (p-type) semiconductor region that is formed in the active region 10, and a body region 14, which is composed of a second conduction-type (p-type) semiconductor region that is formed in the terminal region 20, are installed.

On the drift region 12 and the body region 13 of the active region 10, a gate insulating film 21 and a gate electrode 22 are installed. Further, on the drift region 12 and the body region 14 of the terminal region 20, a field insulating layer 23 is installed.

In the active region 10, the gate electrode 22 is formed on the drift region 12 to extend over a portion of the body region 13. Further, in the active region 10, the gate electrode 24 that is formed on the side of the final terminal region 20 is formed on the drift region 12 to extend over the body region 13 and a portion of the body region 14.

On the surface of the body region 13 of the active region 10, a source region 17 that is composed of a first conduction-type (n-type) semiconductor region is selectively formed at a position in which an end portion of the gate insulating film 21 overlaps on the surface of the body region 13 of the active region 10. Further, on the surface of the body region 13, a potential extraction region (back gate) 15, which is adjacent to the source region 17 and is composed of a second conduction-type ($p^+$-type) semiconductor region that has high impurity concentration for extracting the potential of the body region 13, is formed.

On the surface of the body region 14 of the terminal region 20, a potential extraction region (back gate) 16, which is composed of a second conduction-type ($p^+$-type) semiconductor region that has high impurity concentration for extracting the potential of the body region 14, is formed at a position in which an end portion of the gate electrode 24 that is formed on the side of the final terminal region 20 overlaps. The potential extraction region 16 is selectively formed on a portion on which the field insulating layer 23 is not formed at a position that is close to the active region 10 in the body region 14.

On the active region 10 and the terminal region 20, a source electrode 18, which is connected to the potential extraction region 15 and the potential extraction region 16, is formed. Because of this, the potential extraction region 15 and the potential extraction region 16 have the same potential.

Further, the body regions 13 and 14 and the drift region 12 are in contact with one another to form pn junctions.

Further, as a semiconductor device that achieves both the increase of the device breakdown voltage and the reduction of on-resistance (Ron), a structure that is called a super junction structure, in which drift regions and pillar regions are alternately repeatedly formed, is known.

FIG. 1B shows a cross-section of a vertical DMOSFET having a super junction structure.

In the super junction structure illustrated in FIG. 1B, in addition to the vertical DMOSFET structure illustrated in FIG. 1A, a second conduction-type (p-type) pillar region 25, which is periodically arranged in a direction that is substantially parallel to the main surface of the drain region 11, is formed. The pillar region 25 is connected to the body region 13 in the active region 10. Further, in a range in which the body region 14 is formed in the terminal region 20, the pillar region 25 is formed to be connected to the body region 14. Further, in a range in which the body region 14 is not formed in the terminal region 20, the pillar region 25 is formed from the surface of the drift region 12.

The drift region 12 and the pillar region 25 are adjacent to each other to form a pn junction, that is, a so-called super junction structure. Even in the super junction structure, the terminal region 20 plays an important role for ensuring the breakdown voltage.

In the above-described super junction structure, the pillar region 25 and the drift region 12 have been designed to have the same impurity content. Because of this, when a reverse bias is applied between the drain and the source thereof, the pillar region 25 and the drift region 12 are fully depleted to make the electric field distribution uniform.

Accordingly, in comparison to a case where the super junction structure is not used, high device breakdown voltage can be ensured even if the impurity concentration of the drift region 12 is high. Further, since the impurity concentration of the drift region 12 can be heightened, it is possible to lower the on-resistance (Ron) when the transistor is in an on state. That is, through providing the super junction structure, a semiconductor device that can achieve both the device breakdown voltage and the on-resistance (Ron) can be configured.

[Basic Configuration of a Vertical PN Diode]

Figure 2:
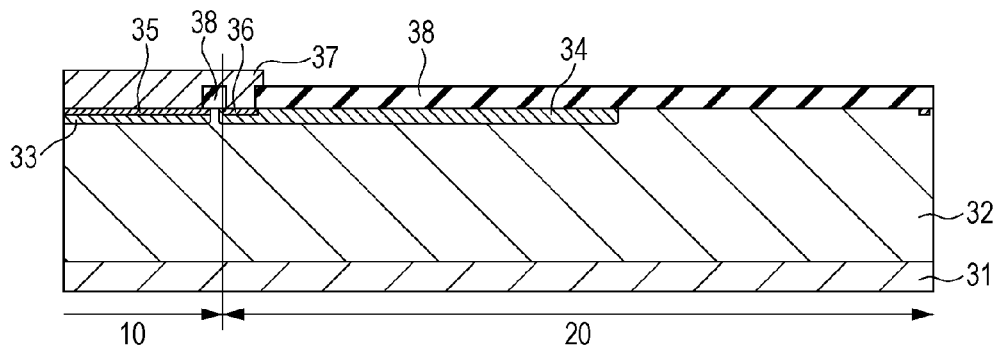
FIG. 2 is a cross-sectional view illustrating the configuration of a vertical PN diode.

Next, in the same manner as the above-described vertical DMOSFET, the cross-section of a vertical PN diode that is applied to a booster converter as a high-voltage power device is shown in FIG. 2.

The vertical PN diode illustrated in FIG. 2 includes an active region 10 and a terminal region 20.

On the main surface of a first conduction-type ($n^+$-type) semiconductor substrate 31 having high impurity concentration, a cathode region 32 composed of a first conduction-type (n-type) semiconductor region is formed.

On the surface of the cathode region 32, an anode region 33 composed of a second conduction-type (p-type) semiconductor region that is formed in the active region 10 and an anode region 34 composed of a second conduction-type (p-type) semiconductor region that is formed on the terminal region 20 are installed.

On the surface of the anode region 33, a potential extraction region 35, which is composed of a second conduction-type ($p^+$-type) semiconductor region having high impurity concentration for extracting the potential of the anode region 33, is formed. Further, on the surface of the anode region 34 of the terminal region 20, a potential extraction region 36, which is composed of a second conduction-type ($p^+$-type) semiconductor region having high impurity concentration for extracting the potential of the anode region 34, is formed. The potential extraction region 36 is formed adjacent to the side of the anode region 34 of the active region 10.

On the potential extraction region 35 and the potential extraction region 36, an anode electrode 37 is formed. Through being connected to each other by the anode electrode 37, the potential extraction region 35 and the potential extraction region 36 have the same potential.

On the terminal region 20, a field insulating layer 38 is formed on the cathode region 32 and the anode region 34 except for the potential extraction region 36. Further, the field insulating layer 38 is formed on the cathode region 32 and the anode region 33 except for a connection portion between the potential extraction region 35 of the active region 10 and the anode electrode 37.

[Operation]

Next, the operation of the semiconductor device as described above will be described. As an example of the operation of the semiconductor device, the operation of the above-described vertical PN diode in the output stage circuit of the boost converter will be described.

FIGS. 3A to 3C are circuit diagrams of an output stage circuit of a boost converter. The output stage circuit illustrated in FIGS. 3A to 3C includes, from the input side, an inductor 41, a vertical DMOSFET 42, a vertical PN diode 43, and a capacitor 44. Further, the above-described vertical PN diode illustrated in FIG. 2 or the vertical DMOSFET illustrated in FIGS. 1A and 1B is applicable as the vertical PN diode 43 of the boost converter. Further, the above-described vertical DMOSFET illustrated in FIGS. 1A and 1B is applicable as the vertical DMOSFET 42 of the boost converter.

Figure 4:
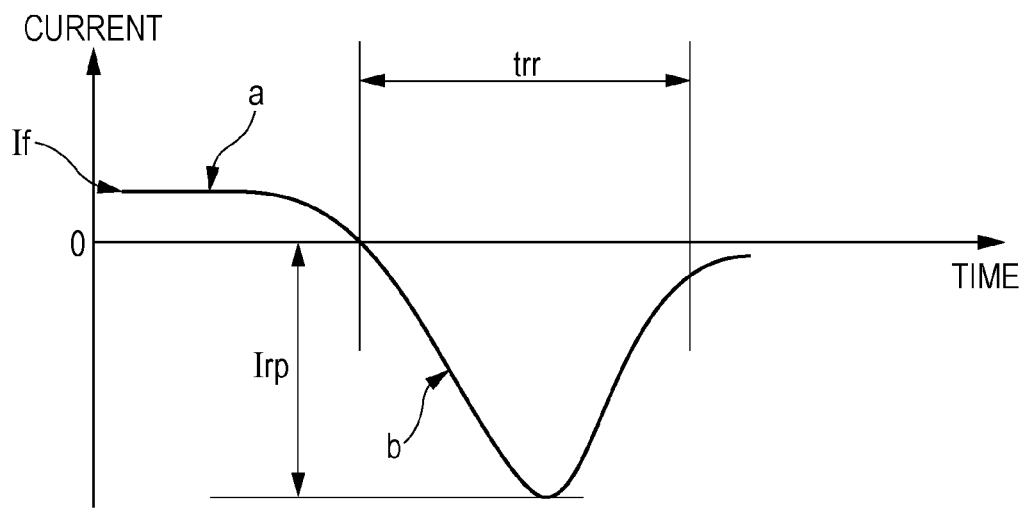
FIG. 4 is a diagram illustrating a current waveform of a vertical PN diode in an output stage circuit of a boost converter.

FIG. 4 is a diagram illustrating a current waveform of the above-described vertical PN diode in the output stage circuit of the boost converter illustrated in FIGS. 3A to 3C.

As illustrated in FIG. 3A, if the vertical DMOSFET 42 is in an on state, current flows from the input terminal to ground through the inductor 41 and the vertical DMOSFET 42.

Next, as illustrated in FIG. 3B, if the vertical DMOSFET 42 is in an off state, the path between the input terminal and the ground is blocked, and the potential of the drain terminal of the vertical DMOSFET 42 rises due to a counter electromotive force of the inductor 41. At this time, since the drain terminal of the vertical DMOSFET 42 and the anode of the vertical PN diode 43 are connected to each other, a forward voltage is applied between the anode and the cathode of the vertical PN diode 43. Because of this, current If flows through the vertical PN diode 43 to charge a capacitor 44.

The current waveform of the current If of the vertical PN diode 43 at this time appears in a region (a) illustrated in FIG. 4.

Next, as illustrated in FIG. 3C, if the vertical DMOSFET 42 becomes an on state again and current flows from the input terminal to the ground through the inductor 41 and the vertical DMOSFET 42, the drain terminal of the vertical DMOSFET 42 rapidly falls to the ground potential. At this time, the anode potential of the vertical PN diode 43 also falls to the ground potential, and thus a reverse bias is rapidly applied between the anode and the cathode thereof. At this time, the current waveform appears in a region (b) illustrated in FIG. 4.

If the reverse bias is rapidly applied between the anode and the cathode of the vertical PN diode 43 as shown as the current waveform in the region (b) illustrated in FIG. 4, a reverse current flows. After the maximum reverse current Irp flows, the reverse current is decreased.

After the maximum reverse current Irp flows, the junction between the anode and the cathode is transited to a state where the depletion layer is expanded. Then, the depletion layer is fully spread over the junction between the anode and the cathode, and a series of transient responses in which a stable reverse bias is applied appears. The time trr until the stable reverse bias is applied is a reverse recovery time.

Figure 5A:
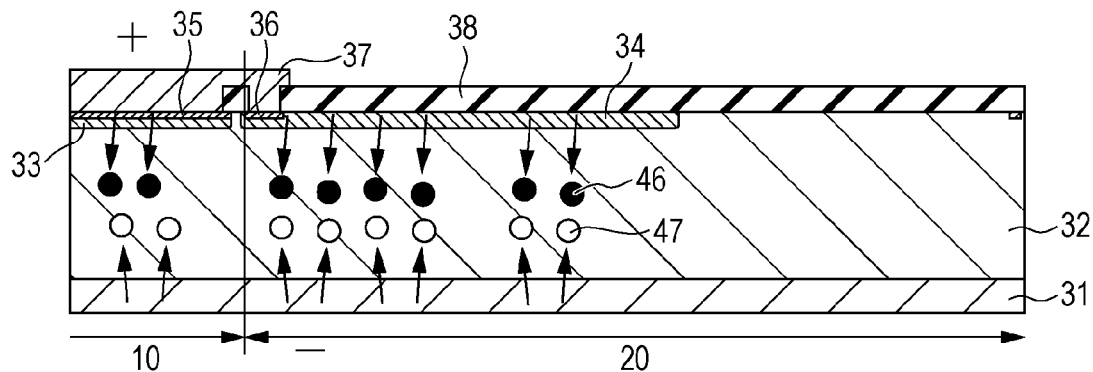
FIGS. 5A and 5B are views showing movement of electrons and holes in a vertical PN diode in an output stage circuit of a boost converter.
Figure 5B:
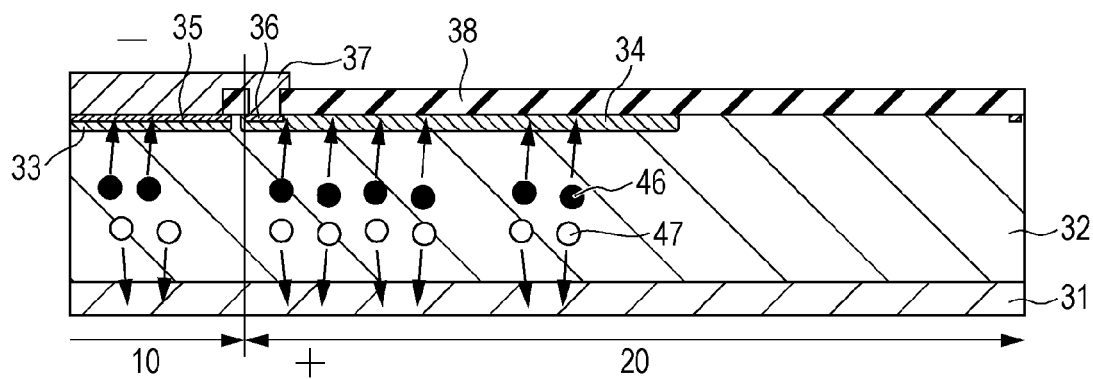

FIGS. 5A and 5B are views showing movement of electrons and holes in the above-described vertical PN diode illustrated in FIG. 2 in the output stage circuit of the above-described boost converter. FIG. 5A is a view showing the movement of electrons and holes when a forward bias is applied to the vertical PN diode. Further, FIG. 5B is a view showing the movement of electrons and holes when a reverse bias is applied to the vertical PN diode.

As illustrated in FIG. 3B, in a state where a forward bias is applied to the vertical PN diode 43, current If flows from the side of the anode electrode 37 to the side of the semiconductor substrate 31. At this time, in the vertical PN diode 43, as illustrated in FIG. 5A, holes 46 flow from the anode regions 33 and 34, which the anode electrode 37 joins, to the cathode region 32, and electrons 47 flow from the side of the semiconductor substrate 31 to the cathode region 32.

Next, as illustrated in FIG. 3C, in a state where a reverse bias is applied to the vertical PN diode 43, reverse current flows from the side of the semiconductor substrate 31 to the side of the anode electrode 37. The phenomenon of the reverse current flow will be described using the vertical PN diode 43 illustrated in FIG. 5B.

In the vertical PN diode 43 in a state where the reverse bias is applied, the reverse bias is rapidly applied before the holes 46, which are minority carriers and flow into the cathode region 32, are recombined with the electrons 47, which are majority carriers, to vanish. Because of this, the holes 46, which are minority carriers that remain in the cathode region 32 without being recombined, are drawn by the negative potential of the anode regions 33 and 34 to which the reverse potential is applied. Through this phenomenon, current flows from the cathode region 32 to the anode regions 33 and 34 in the vertical PN diode 43.

Figure 6:
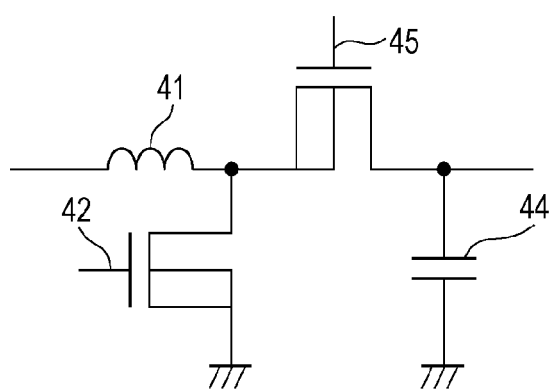
FIG. 6 is a circuit diagram of an output stage circuit of a boost converter.

In the output stage circuit of the boost converter illustrated in FIGS. 3A to 3C, the vertical DMOSFET illustrated in FIGS. 1A and 1B may be used instead of the vertical PN diode. FIG. 6 shows an output stage circuit of a boost converter using a vertical DMOSFET.

Figure 7A:
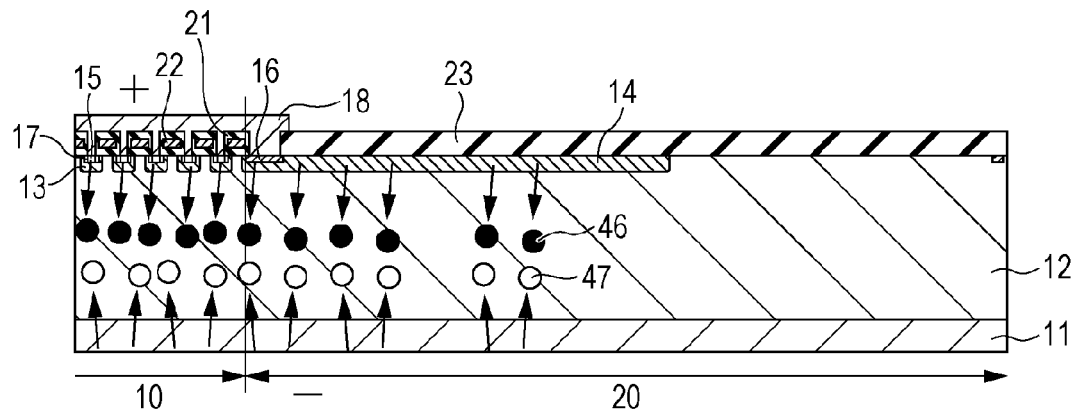
FIGS. 7A and 7B are views showing movement of electrons and holes in a vertical DMOSFET in an output stage circuit of a boost converter.
Figure 7B:
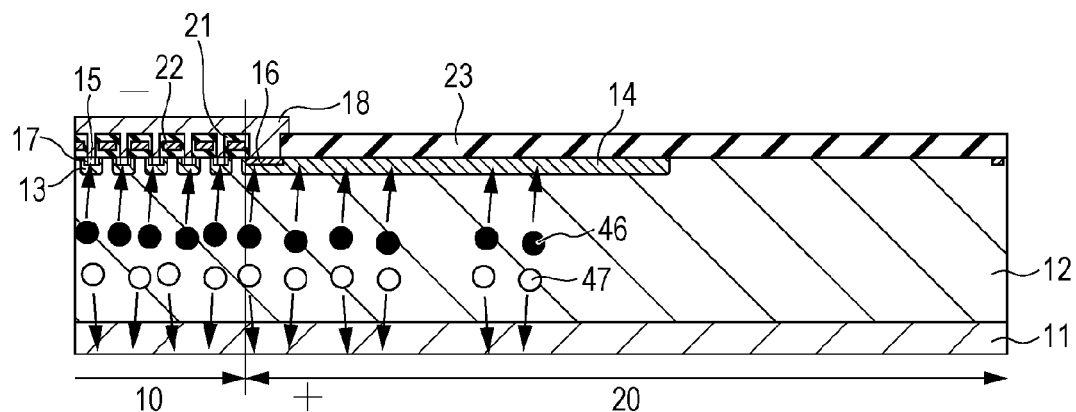

In the output stage circuit of the boost converter, the movement of electrons and holes in the vertical DMOSFET is shown in FIGS. 7A and 7B. FIG. 7A is a view illustrating the movement of electrons and holes when the forward bias is applied to the vertical DMOSFET. Further, FIG. 7B is a view illustrating the movement of electrons and holes when the reverse bias is applied to the vertical DMOSFET.

The output stage circuit of the boost converter illustrated in FIG. 6 includes, from the input side, an inductor 41, a vertical DMOSFET 42, a vertical DMOSFET 45, and a capacitor 44.

The operation of the output stage circuit of the boost converter illustrated in FIG. 6 is the same as the operation of the output stage circuit of the boost converter illustrated in FIG. 3 except that the vertical DMOSFET 45 is used. Further, the current waveform of the vertical DMOSFET 45 is the same as the current waveform illustrated in FIG. 4.

In the output stage circuit of the boost converter, the movement of electrons and holes in the vertical DMOSFET 45 is performed using a so-called body diode between the drain region 11 and the potential extraction regions (back gates) 15 and 16. This is the same operation as that of the vertical PN diode illustrated in FIGS. 5A and 5B.

That is, as illustrated in FIG. 7A, in a state where a forward bias is applied to the vertical DMOSFET 45, current If flows from the side of the source electrode 18 to the side of the drain region 11. At this time, in the vertical DMOSFET 45, holes 46 flow from the body regions 13 and 14 which the source electrode 18 joins to the drift region 12, and electrons 47 flow from the side of the drain region 11 to the drift region 12.

Further, as illustrated in FIG. 7B, in a state where a reverse bias is applied to the vertical DMOSFET 45, reverse current flows from the side of the drain region 11 to the side of the source electrode 18. At this time, in the vertical DMOSFET 45, the reverse bias is rapidly applied before the holes 46, which are minority carriers and flow into the drift region 12, are recombined with the electrons 47, which are majority carriers. Because of this, the holes 46, which are minority carriers that remain in the drift region 12 without being recombined, are drawn by the negative potential of the body regions 13 and 14 to which the reverse potential is applied.

The reverse recovery time trr is a time until the holes 46 in the cathode region 32 are completely drawn by the negative potential of the anode regions 33 and 34 and the cathode region 32 is completely depleted in the vertical PN diode 43. Further, the reverse recovery time trr is a time unit the holes 46 in the drift region 12 is completely drawn by the negative potential of the body regions 13 and 14 and the drift region 12 is completely depleted in the vertical DMOSFET 45.

Here, as illustrated in FIG. 4, the trr may be defined as a time from a point where the current If becomes the reverse current in the vertical PN diode 43 or the vertical DMOSFET 45 to a point where the current If drops to be equal to or lower than 10% of the maximum reverse current Irp.

If the trr is long in the transient operation of the above-described diode, the circuit operation slows down, and the time when the reverse current flow becomes long. Accordingly, current consumption is increased, and the efficiency is lowered.

Further, in the vertical PN diode having the above-described structure and the high-voltage vertical DMOSFET, the terminal region 20 is installed around the active region 10. By installing the terminal region 20, the depletion layer can be widened up to the terminal region 20 on the outside of the active region 10, and thus it is possible to achieve high voltage. That is, the structure of the terminal region 20 is necessary in terms of the breakdown voltage ensuring.

In particular, if the overhang amount of the body region 14 and the anode region 34 is small in the terminal region 20, it is difficult to extend the depletion layer, and thus the breakdown voltage is lowered.

On the other hand, in terms of the transient operation of the diode, it is preferable to reduce the overhang amount of the body region 14 of the vertical DMOSFET or the anode region 34 of the vertical PN diode. If the overhang amount of the body region 14 of the vertical DMOSFET or the anode region 34 of the vertical PN diode is increased, the area of the PN junction of the diode is increased. If the area of the PN junction is increased, the number of holes 46, which are injected when the forward bias is applied, is increased. Further, the holes 46, which are minority carriers, have poor drawing efficiency when the reverse bias is applied, and if the number of holes 46 is increased, complete depletion of the cathode region 32 or the drift region 12 is delayed. Accordingly, in order to achieve the shortening of the trr and the reduction of the maximum reverse current Irp, it is necessary to reduce the amount of overhang.

As described above, in the vertical PN diode and the vertical DMOSFET which are semiconductor devices applied to high-voltage power devices, it was difficult to achieve both the breakdown voltage insurance and the reduction of the reverse recovery time trr and the maximum reverse current Irp.

The present disclosure provides a semiconductor device that can achieve the breakdown voltage insurance and reduction of the reverse recovery time trr and the maximum reverse current Irp. In particular, the present disclosure provides a MOSFET structure and a diode structure which can be applied to a high-voltage power device.

<2. First Embodiment of a Semiconductor Device>

[Vertical PN Diode]

Figure 8:
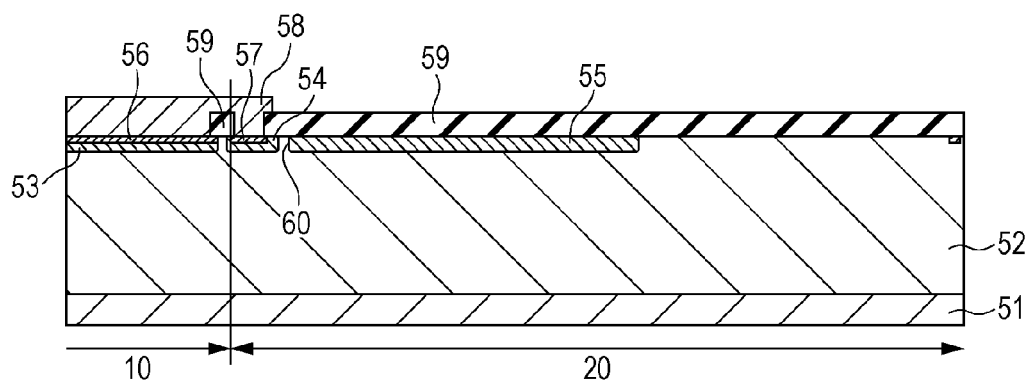
FIG. 8 is a cross-sectional view illustrating the configuration of a semiconductor device according to a first embodiment.

Hereinafter, a first embodiment of the semiconductor device will be described. FIG. 8 is a cross-sectional view illustrating a semiconductor device of a vertical PN diode structure that is used in a high-voltage power device as an example of a semiconductor device according to the first embodiment.

The vertical PN diode illustrated in FIG. 8 includes an active region 10 and a terminal region 20. The active region 10 is a region in which active elements such as transistors and wires are formed in the vertical PN diode. The terminal region 20 is installed on the outer periphery of the active region, and is a region in which no element is formed.

On the main surface of a first conduction-type ($n^+$-type) semiconductor substrate 51 having high impurity concentration, a cathode region 52 that is composed of a first conduction-type (n-type) semiconductor region is formed.

On the surface of the cathode region 52 in the active region 10, a first anode region 53 that is composed of a second conduction-type (p-type) semiconductor region is formed. Further, on the surface of the cathode region 52 of the terminal region 20, a second anode region 54 that is composed of a second conduction-type (p-type) semiconductor region and a third anode region 55 that is composed of a second conduction-type (p-type) semiconductor region are installed.

Further, the second anode region 54 is formed at a position of the terminal region 20 that is adjacent to the active region 10. Further, the third anode region 55 that is separated by the cathode region 52 is formed on the outer periphery side of the second anode region 54. A gap 60 formed by the cathode region 52 is installed between the second anode region 54 and the third anode region 55.

The length of the gap 60 is set to be equal to or shorter than the distance which a depletion layer that spreads from the side of the second anode region 54 reaches. That is, when a reverse bias is applied to the vertical PN diode, in the vicinity of the surface of the cathode region 52, the depletion layer spreads from an end portion of the second anode region 54 to an end portion of the third anode region 55. Further, due to potential propagation caused by the depletion layer, punch-through is formed in the gap 60 between the second anode region 54 and the third anode region 55. The gap 60 is set to a length in which the second anode region 54 and the third anode region 55 can be electrically connected to each other through the punch-through.

On the surface of the first anode region 53, a first potential extraction region 56 that is composed of a second conduction-type ($p^+$-type) semiconductor region having high impurity concentration for extracting the potential of the first anode region 53 is formed.

Further, on the surface of the second anode region 54 of the terminal area 20, a second potential extraction region 57 that is composed of a second conduction-type ($p^+$-type) semiconductor region having high impurity concentration for extracting the potential of the second anode region 54 is formed. The second potential extraction region 57 is formed on the side of the active region 10 in the second anode region 54.

On the first potential extraction region 56 and the second potential extraction region 57, an anode electrode 58 is formed. Since a common electrode is connected to the first potential extraction region 56 and the second potential extraction region 57, the first potential extraction region 56 and the second potential extraction region 57 have the same potential.

In the terminal region 20, a field insulating layer 59 is formed on the second anode region 54, the third anode region 55, and the cathode region 52 except for the second potential extraction region 57. In the same manner, the field insulating layer 59 is formed on the first potential extraction region 56 and the cathode region 52 except for the connection portion between the first potential extraction region 56 of the active region 10 and the anode electrode 58.

The vertical high-voltage power device, which is represented by the vertical PN diode or the like illustrated in FIG. 8, ensures a high voltage by means of the thickness (depth) of the cathode region 52 in the vertical direction and impurity concentration of the cathode region 52. Further, in the terminal region 20 that is formed on an outer side of the active region 10, a p-type semiconductor region (anode region) for controlling the lateral electric field is electrically separated from the second anode region 54 and the third anode region 55.

[Operation]

In the above-described vertical PN diode, the gap 60 is formed to be equal to or shorter than a length which a depletion layer that spreads from the second anode region 54 to outside reaches the third anode region 55. Because of this, when a reverse bias is applied to the vertical PN diode, the depletion layer that extends from the end portion side of the second anode region 54 to the end portion of the third anode region 55 is formed in the gap 60 between the second anode region 54 and the third anode region 55. Further, since the depletion layer extends from the second anode region 54 to the third anode region 55, punch-through is formed in the gap 60 by the potential propagation due to the depletion layer. Because of this, the second anode region 54 and the third anode region 55 are electrically connected to each other.

As described above, if the reverse bias is applied to the vertical PN diode, electrical contact is formed between the second anode region 54 and the third anode region 55. Accordingly, the area of the p-type semiconductor region (anode region) on the surface of the cathode region 52 of the terminal region 20 can be increased, and the breakdown voltage of the semiconductor device can be ensured.

Further, in the above-described vertical PN diode, the second anode region 54 and the third anode region 55 are electrically separated from each other, and the anode electrode 58 is connected to the second anode region 54 only, but is not connected to the third anode region 55.

When a forward bias is applied to the vertical PN diode, diffusion of the depletion layer from the second anode region 54 does not occur, and thus the second anode region 54 and the third anode region 55 are in an electrically separated state from each other.

That is, when the forward bias is applied, the portion of the third anode region 55 is excluded from the junction area of the PN diode, and thus the effective junction area of the PN diode can be reduced.

As a result, the number of holes that are injected into the cathode region 52 when the forward bias is applied can be decreased, and it becomes possible to shorten the time for which the holes are drawn out when the forward bias is applied. Accordingly, complete depletion of the cathode region 52 is facilitated, and reduction of trr and Irp becomes possible.

<3. Modified Example of the First Embodiment of the Semiconductor Device>

Next, a modified example of the semiconductor device having the vertical PN diode structure according to the first embodiment will be described. In the following description, the same reference numerals are used for the same configurations as the first embodiment, and the detailed explanation thereof will be omitted.

[Vertical PN Diode (Field Electrode)]

Figure 9:
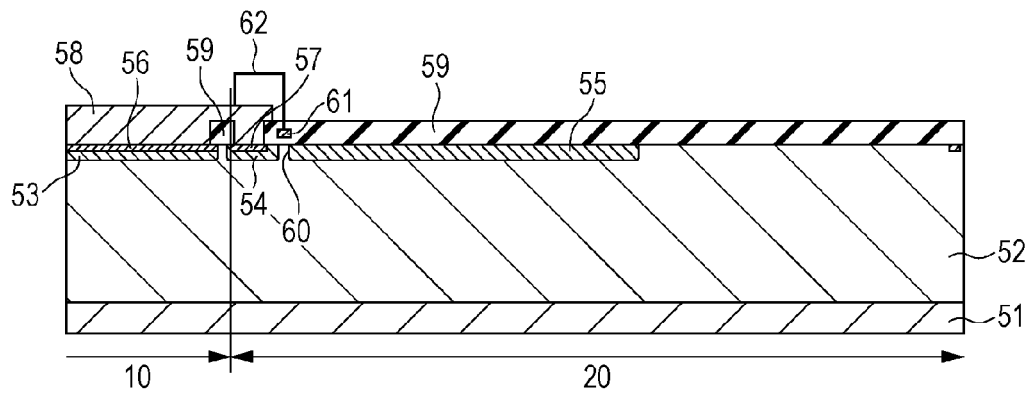
FIG. 9 is a cross-sectional view illustrating the configuration of a semiconductor device according to a modified example of the first embodiment.

FIG. 9 shows the vertical PN diode structure according to modified example 1 of the first embodiment.

A semiconductor device illustrated in FIG. 9 includes an active region 10 and a terminal region 20. On the main surface of a semiconductor substrate 51, a cathode region 52 is formed. On the surface of the cathode region 52 in the active region 10, a first anode region 53 is formed. Further, on the surface of the cathode region 52 of the terminal region 20, a second anode region 54 and a third anode region 55 are installed.

On the surface of the first anode region 53, a first potential extraction region 56 for extracting the potential of the first anode region 53 is formed.

Further, on the surface of the second anode region 54, a second potential extraction region 57 for extracting the potential of the second anode region 54 is formed. On the first potential extraction region 56 and the second potential extraction region 57, an anode electrode 58 is formed.

The second anode region 54 is formed at a position of the terminal region 20 that is adjacent to the active region 10. Further, the third anode region 55 that is separated by the cathode region 52 is formed on the outer periphery side of the second anode region 54. A gap 60 formed by the cathode region 52 is installed between the second anode region 54 and the third anode region 55.

Further, in the terminal region 20, a field electrode 61 is formed on the cathode region 52 of the gap 60 through a field insulating layer 59. On the gap 60, the field electrode 61 is formed to extend over portions of the second anode region 54 and the third anode region 55. Further, the field electrode 61 and the anode electrode 58 are connected by a file wire 62.

Through this, a horizontal MOSFET is configured which has the field electrode 61 as a gate electrode, a field insulating layer 59 as a gate insulating film, and the second anode region 54 and the third anode region 55, which are separated by the cathode region 52 of the gap 60, as a source and a drain.

[Operation]

In the semiconductor device according to the above-described modified example of the first embodiment, the field electrode 61 that is connected to the anode electrode 58 is formed on the gap 60. Through this, when a reverse bias is applied to the vertical PN diode, the first potential extraction region 56, the second potential extraction region 57, and the field electrode 61 interlock with one another. Further, when a voltage is applied to the field electrode 61, the horizontal MOSFET, which is composed of the field electrode 61, the second anode region 54, the third anode region 55, and the cathode region 52 of the gap 60, is in a turned-on state. At this time, a channel region is formed just below the field electrode 61, that is, on the cathode region 52 of the gap 60 between the second anode region 54 and the third anode region 55. Through this channel region, the second anode region 54 and the third anode region 55 are electrically connected.

Accordingly, in the vertical PN diode illustrated in FIG. 9, the second anode region 54 and the third anode region 55 are electrically connected, and the area of the p-type semiconductor region (anode region) of the terminal region on the surface of the cathode region 52 of the terminal region is increased. Because of this, the breakdown voltage of the semiconductor device is improved.

Further, in the above-described vertical PN diode, if a forward bias is applied, the horizontal MOSFET, which is composed of the field electrode 61, the second anode region 54, the third anode region 55, and the cathode region 52 of the gap 60, is in a turned-off state. At this time, a channel region is not formed in the gap 60 between the second anode region 54 and the third anode region 55. Because of this, when the forward bias is applied to the vertical PN diode, the second anode region 54 and the third anode region 55 are in an electrically separated state from each other.

That is, when the forward bias is applied, the third anode region 55 is separated, and thus the execution junction area of the PN diode can be reduced. As a result, the number of holes that are injected into the cathode region 52 when the forward bias is applied can be reduced, and reduction of trr and Irp becomes possible.

<4. Second Embodiment of a Semiconductor Device>

[Vertical DMOSFET]

Figure 10:
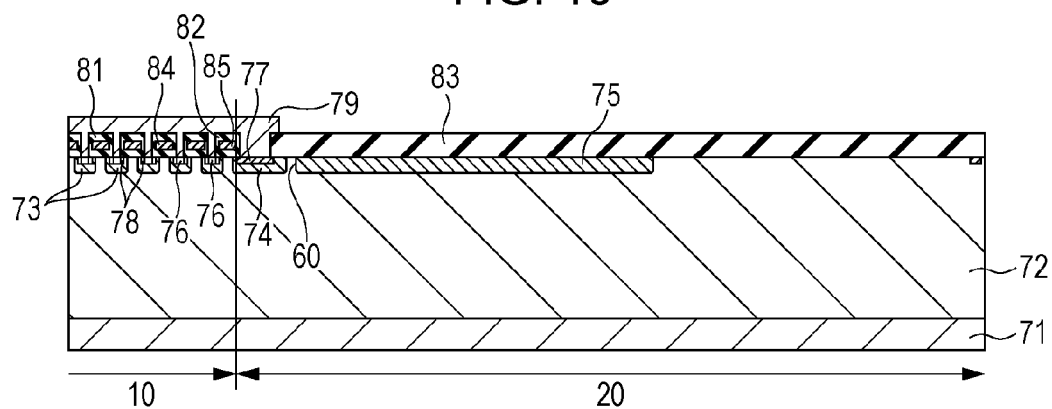
FIG. 10 is a cross-sectional view illustrating the configuration of a semiconductor device according to a second embodiment.

Next, a second embodiment of the semiconductor device will be described. FIG. 10 is a cross-sectional view illustrating a semiconductor device of a vertical DMOSFET structure that is used in a high-voltage power device as an example of a semiconductor device according to the second embodiment.

The vertical DMOSFET illustrated in FIG. 10 includes an active region 10 and a terminal region 20. The active region 10 is a region in which active elements such as transistors and wires are formed in the vertical PN diode. The terminal region 20 is installed on the outer periphery of the active region, and is a region in which no element is formed.

On the main surface of a drain region 71 composed of a first conduction-type (n$^+$-type) semiconductor substrate having high impurity concentration, a drift region 72 that is composed of a first conduction-type (n-type) semiconductor region is formed.

On the surface of the drift region 72 in the active region 10, a first body region 73 that is composed of a second conduction-type (p-type) semiconductor region is formed. On the surface of the drift region 72 of the terminal region 20, a second body region 74 which is composed of a second conduction-type (p-type) semiconductor region that is composed of a second conduction-type (p-type) semiconductor region, and a third body region 75 which is composed of a second conduction-type (p-type) semiconductor region are installed.

Further, the second body region 74 is formed at a position of the terminal region 20 that is adjacent to the active region 10. Further, the third body region 75 that is separated by the drift region 72 is formed on the outer periphery side of the second body region 74. A gap 60 formed by the drift region 72 is installed between the second body region 74 and the third body region 75.

The length of the gap 60 is set to be equal to or shorter than the distance which a depletion layer that spreads from the side of the second body region 74 to outside reaches. That is, when a reverse bias is applied to the vertical DMOSFET, the depletion layer spreads in the vicinity of the surface of the drift region 72, from an end portion of the second body region 74 to an end portion of the third body region 75. Further, due to potential propagation caused by the depletion layer, which extends from the end portion side of the second body region 74 to the end portion side of the third body region 75, punch-through is formed in the gap 60. Further, through the formed punch-through, the gap 60 is set to a length in which the second body region 74 and the third body region 75 can be electrically connected to each other.

On the drift region 72 and the first body region 73 of the active region 10, a first gate insulating film 81, a second gate insulating film 82, and a source electrode 79 are installed. Further, on the drift region 72, the second body region 74, and the third body region 75 of the terminal region 20, a filed insulating layer 83 is installed.

Further, on the drift region 72 and the first body region 73 of the active region 10, a first gate electrode 84 is formed through the first gate insulating film 81. Further, a second gate electrode 85 is formed through the second gate insulating film 82.

In the active region 10, the first gate electrode 84 is formed on the drift region 72 between the first body regions 73 at a position in which the first gate electrode 84 extends over a portion of the first body region 73.

Further, in the active region 10, the second gate electrode 85 is formed at a position that is close to the final terminal region 20. Further, the second gate electrode 85 is formed on the drift region 72 between the first body region 73 and the second body region 74 at a position in which the second gate electrode 85 extends over a portion of the first body region 73 and a portion of the second body region 74.

On the surface of the first body region 73 of the active region 10, a source region 78 that is composed of a first conduction-type (n-type) semiconductor region is selectively formed at a position in which an end portion of the gate electrode 84 overlaps. Further, on the surface of the first body region 73, a first potential extraction region (back gate) 76, which is adjacent to the source region 78 and is composed of a second conduction-type (p$^+$-type) semiconductor region that has high impurity concentration for extracting the potential of the first body region 73, is formed.

On the surface of the second body region 74 of the terminal region 20, a second potential extraction region (back gate) 77, which is composed of a second conduction-type (p$^+$-type) semiconductor region that has high impurity concentration for extracting the potential of the second body region 74, is formed at a position in which an end portion of the second gate electrode 85 that is formed on the side of the final terminal region 20 overlaps. The second potential extraction region 77 is selectively formed at a position that is close to the active region 10 in the second body region 74.

Further, in the terminal region 20, a filed insulating layer 83 is formed on the second body region 74, the third body region 75, and the drift region 72 except for the second potential extraction region 77.

The first body region 73, the second body region 74, the third body region 75, and the drift region 72 are in contact with one another to form pn junctions. A source electrode 79 is formed on the first potential extraction region 76 and the second potential extraction region 77. Since a common electrode is connected to the first potential extraction region 76 and the second potential extraction region 77, the first potential extraction region 76 and the second potential extraction region 77 have the same potential.

The vertical high-voltage power device, which is represented by the vertical DMOSFET or the like illustrated in FIG. 10, ensures a high voltage by means of the thickness (depth) of the drift region 72 in the vertical direction and the impurity concentration of the drift region 72. Further, in the terminal region 20 that is formed on an outer side of the active region 10, the p-type semiconductor region (body region) for controlling the lateral electric field is electrically separated from the first body region 73, the second body region 74, and the third body region 75.

[Operation]

In the above-described vertical DMOSFET, the gap 60 is formed to be equal to or shorter than a length which a depletion layer that spreads from the second body region 74 to outside reaches the third body region 75. Because of this, when a reverse bias is applied to the vertical DMOSFET, punch-through that is caused by the depletion is formed in the gap 60 between the second body region 74 and the third body region 75. Because of this, the second body region 74 and the third body region 75 are electrically connected to each other.

As described above, if the reverse bias is applied to the vertical DMOSFET, electrical contact is formed between the second body region 74 and the third body region 75. Accordingly, the area of the p-type semiconductor region (body region) on the surface of the drift region 72 of the terminal region 20 can be increased, and the breakdown voltage of the semiconductor device is improved.

Further, in the above-described vertical DMOSFET, the second body region 74 and the third body region 75 are electrically separated from each other, and the source electrode 79 is connected to the second body region 74 only.

When a forward bias is applied to the vertical DMOSFET, diffusion of the depletion layer from the second body region 74 does not occur, and thus the second body region 74 and the third body region 75 are in an electrically separated state from each other.

That is, when the forward bias is applied, the portion of the third body region 75 is excluded from the junction area of the PN diode, and thus the effective junction area of the PN diode can be reduced.

As a result, the number of holes that are injected into the drift region 72 when the forward bias is applied can be decreased, and it becomes possible to shorten the time for which the holes are drawn out when the reverse bias is applied. Accordingly, complete depletion of the drift region 72 is facilitated, and reduction of trr and Irp becomes possible.

<5. Modified Example of the Second Embodiment of the Semiconductor Device>

Next, a modified example of the semiconductor device having the vertical DMOSFET structure according to the second embodiment will be described. In the following description, the same reference numerals are used for the same configurations as the above-described first embodiment and second embodiment, and the detailed explanation thereof will be omitted.

Modified Example 1

Vertical DMOSFET (Third Gate Electrode)

Figure 11:
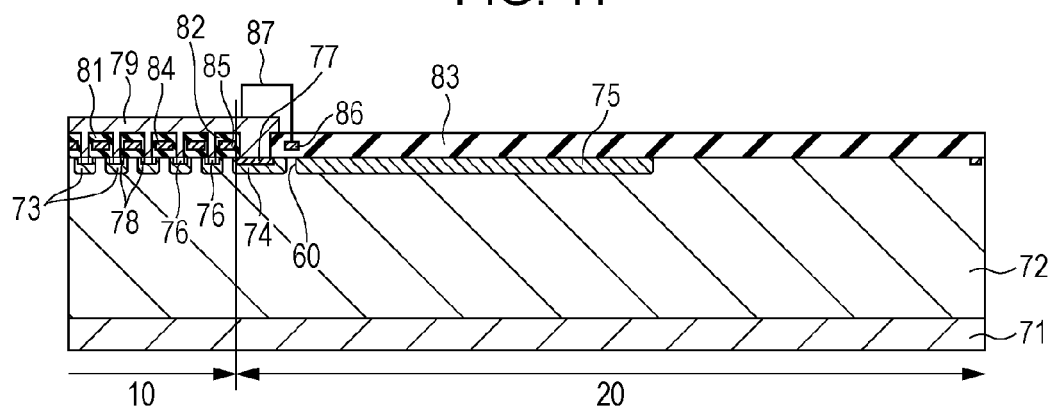
FIG. 11 is a cross-sectional view illustrating the configuration of a semiconductor device according to a modified example 1 of the second embodiment.

A semiconductor device according modified example 1 of the second embodiment will be described. FIG. 11 shows the semiconductor device having the vertical DMOSFET structure according to modified example 1 of the second embodiment. The vertical DMOSFET illustrated in FIG. 11 includes an active region 10 and a terminal region 20.

On the main surface of the drain region 71, the drift region 72 is formed. On the surface of the drift region 72 in the active region 10, the first body region 73 is formed. Further, on the surface of the drift region 72 of the terminal region 20, the second body region 74 and the third body region 75 are installed.

The second body region 74 is formed at a position that is adjacent to the active region 10 in the terminal region 20, and the third body region 75 that is electrically separated by the gap 60 composed of the drift region 72 on the outer periphery of the second body region 74.

On the drift region 72 and the first body region 73 of the active region 10, the first gate insulating film 81, the first gate electrode 84, the second gate insulating film 82, the second gate electrode 85, and the source electrode 79 is installed.

Further, on the drift region 72 of the terminal region 20, the second body region 74, and the third body region 75, the field insulating layer 83 is installed.

Further, in the terminal region 20, a third gate electrode 86 is formed on the drift region 72 of the gap 60 through the field insulating layer 83. On the gap 60, the third gate electrode 86 is formed to extend over portions of the second body region 74 and the third body region 75. Further, the third gate electrode 86 and the source electrode 79 are connected by a gate wire 87.

Through this, a vertical MOSFET is configured which has the field insulating layer 83 as the third gate insulating film, and the second body region 74 and the third body region 75, which are separated by the third gate electrode 86 and the drift region 72 of the gap 60, as a source and a drain.

On the surface of the first body region 73 of the active region 10, the source region 78 and the first potential extraction region (back gate) 76 are formed to extract the potential of the first body region 73.

Further, on the surface of the second body region 74 of the terminal region 20, the second potential extraction region (back gat) 77 for extracting the potential of the second body region 74 is formed at a position in which the end portion of the second gate electrode 85 that is formed on the side of the final terminal region 20 overlaps.

[Operation]

In the semiconductor device according to the above-described modified example 1 of the second embodiment, the third gate electrode 86 that is connected to the source electrode 79 is formed on the gap 60. Through this, when a reverse bias is applied to the vertical DMOSFET, the first potential extraction region 76, the second potential extraction region 77, and the third gate electrode 86 interlock with one another. Further, when a voltage is applied to the third gate electrode 86, the horizontal MOSFET, which is composed of the third gate electrode 86, the second body region 74, the third body region 75, and the drift region 72 of the gap 60, is in a turned-on state. At this time, a channel region is formed just below the third gate electrode 86, that is, on the drift region 72 of the gap 60 between the second body region 74 and the third body region 75. Through this channel region, the second body region 74 and the third body region 75 are electrically connected.

Accordingly, in the vertical DMOSFET illustrated in FIG. 11, the second body region 74 and the third body region 75 are electrically connected, and the area of the p-type semiconductor region (body region) of the terminal region on the surface of the drift region 72 of the terminal region is increased. Because of this, the breakdown voltage of the semiconductor device is improved.

Further, in the above-described vertical DMOSFET, if a forward bias is applied, the horizontal MOSFET, which is composed of the third gate electrode 86, the second body region 74, the third body region 75, and the drift region 72 of the gap 60, is in a turned-off state. At this time, a channel region is not formed in the gap 60 between the second body region 74 and the third body region 75. Because of this, when the forward bias is applied to the vertical DMOSFET, the second body region 74 and the third body region 75 are in an electrically separated state from each other.

That is, when the forward bias is applied, the third body region 75 is separated, and thus the execution junction area of the PN diode can be reduced. As a result, the number of holes that are injected into the drift region 72 when the forward bias is applied can be reduced, and reduction of trr and Irp becomes possible.

Modified Example 2

Vertical DMOSFET (Third Gate Electrode, Pillar)

Figure 12:
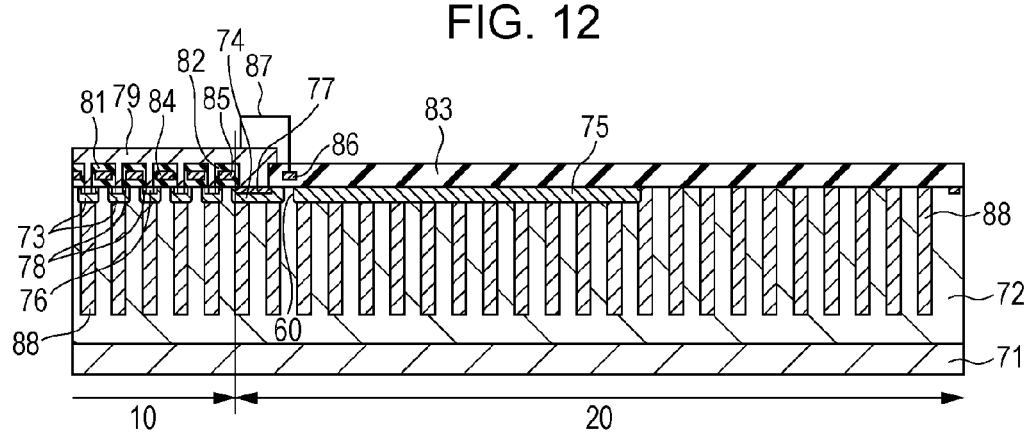
FIG. 12 is a cross-sectional view illustrating the configuration of a semiconductor device according to a modified example 2 of the second embodiment.

Next, a semiconductor device according to modified example 2 of the second embodiment will be described. FIG. 12 shows a semiconductor device having the vertical DMOSFET structure according to modified example 2 of the second embodiment.

The semiconductor device according to modified example 2 of the second embodiment illustrated in FIG. 12 has a structure that is called a super junction structure, in which drift regions 72 and pillar regions 88 are alternately repeatedly formed.

In the super junction structure illustrated in FIG. 12, in addition to the vertical DMOSFET structure according to modified example 1 of the second embodiment illustrated in FIG. 11 as described above, a pillar region 88 is formed in the drift region 72. The pillar region 88 is periodically arranged in a direction that is substantially parallel to the main surface of the drain region 71.

In the active region 10, the pillar region 88 is connected to the first body region 73.

In the terminal region 20, in a range in which the second body region 74 and the third body region 75 are formed, the second body region 74 and the third body region 75 are connected to form the pillar region 88. Further, in a range in which the second body region 74 and the third body region 75 are not formed, the pillar region 88 is formed from the surface of the drift region 72.

Further, the semiconductor device according to the modified example 2 of the second embodiment has the same configuration as the modified example 1 of the second embodiment as described above except that the pillar region 88 is formed. Further, except that the pillar is formed, it operates in the same manner as the modified example 1 of the second embodiment as described above.

Through the above-described super junction structure, the pillar region 88 that is composed of the p-type semiconductor region is connected to the first body region 73, the second body region 74, and the third body region 75, and the p-type semiconductor region that is formed on the drift region 72 is extended. Through this, the semiconductor device according to modified example 2 of the second embodiment is more superior to that according to modified example 1 of the second embodiment in ensuring the device breakdown voltage and reducing the on-resistance (Ron).

Further, in the same manner as the semiconductor device according to the modified example 1 of the second embodiment as described above, when the forward bias is applied, the channel region is not formed on the gap 60, and the second body region 74 and the third body region 75 are in an electrically separated state from each other. Through this, it is possible to reduce trr and Irp.

Modified Example 3

Vertical DMOSFET (Pillar)

Next, a semiconductor device according to modified example 3 of the second embodiment will be described.

Figure 13:
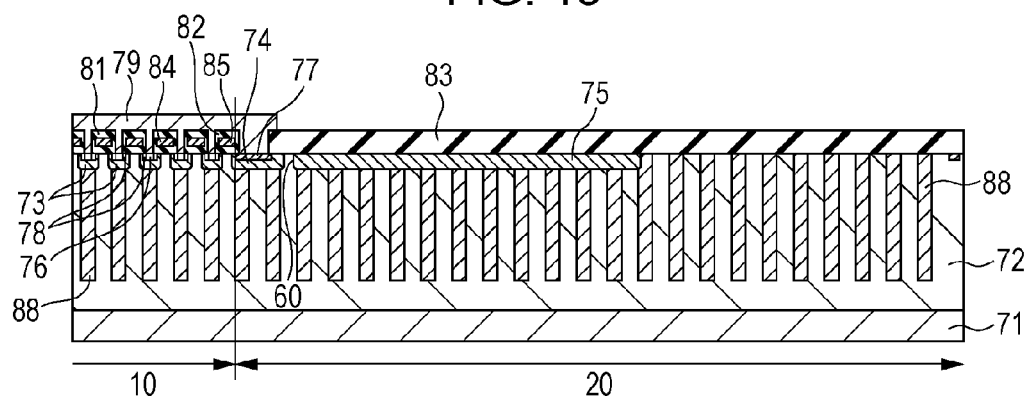
FIG. 13 is a cross-sectional view illustrating the configuration of a semiconductor device according to a modified example 3 of the second embodiment.

FIG. 13 shows a semiconductor device having the vertical DMOSFET structure according to modified example 3 of the second embodiment. The semiconductor device according to modified example 3 of the second embodiment illustrated in FIG. 13 has a structure that is called a super junction structure, in which drift regions 72 and pillar regions 88 are alternately repeatedly formed.

Further, in the super junction structure illustrated in FIG. 13, in addition to the vertical DMOSFET structure according to the second embodiment illustrated in FIG. 10, a pillar region 88 is formed in the drift region 72. The pillar region 88 is periodically arranged in a direction that is substantially parallel to the main surface of the drain region 71.

In the active region 10, the pillar region 88 is connected to the first body region 73. Further, in the terminal region 20, in a range in which the second body region 74 and the third body region 75 are formed, the second body region 74 and the third body region 75 are connected to form the pillar region 88. Further, in a range in which the second body region 74 and the third body region 75 are not formed, the pillar region 88 is formed from the surface of the drift region 72.

Further, the semiconductor device according to the modified example 3 of the second embodiment has the same configuration as the second embodiment as described above except that the pillar region 88 is formed. Further, except that the pillar is formed, it operates in the same manner as the second embodiment as described above.

Through the above-described super junction structure, the pillar region 88 that is composed of the p-type semiconductor region is connected to the first body region 73, the second body region 74, and the third body region 75, and the p-type semiconductor region that is formed on the drift region 72 is extended. Through this, the semiconductor device according to modified example 3 of the second embodiment is more superior to that according to the second embodiment in ensuring the device breakdown voltage and reducing the on-resistance (Ron).

Further, in the same manner as the semiconductor device according to the second embodiment as described above, when the forward bias is applied, the channel region is not formed on the gap 60, and the second body region 74 and the third body region 75 are in an electrically separated state from each other. Through this, it is possible to reduce trr and Irp.

<6. Operation of a Semiconductor Device>

Next, as an example of the operation of the semiconductor device according to the first embodiment and the second embodiment as described above, a case where the semiconductor device is applied to the output stage circuit of a boost converter illustrated in FIGS. 3A to 3C or FIG. 6 will be described. Further, the output stage circuit of the boost converter has the same configuration as that illustrated in FIGS. 3A to 3C or FIG. 6 as described above, the detailed explanation thereof will be omitted.

[Operation 1: Punch-Through]

In the terminal region 20, the operation of the semiconductor device in which punch-through is formed through the depletion will be described as an example of the semiconductor device according to the second embodiment as described above.

Figure 14A:
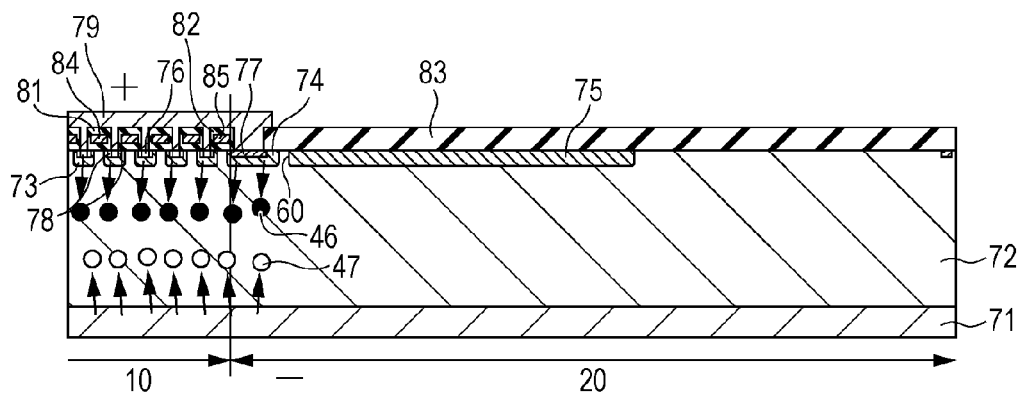
FIGS. 14A and 14B are views showing movement of electrons and holes in the semiconductor device according to the second embodiment.
Figure 14B:
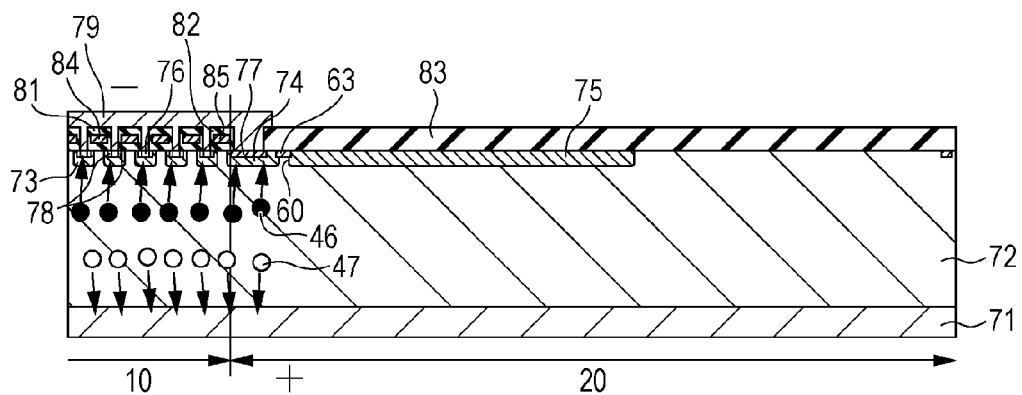

Movement of electrons and holes of the semiconductor device according to the second embodiment in the output stage circuit of the boost converter is shown in FIGS. 14A and 14B. FIG. 14A is a view showing the movement of electrons and holes when a forward bias is applied to the semiconductor device according to the second embodiment, and FIG. 14B is a view showing the movement of electrons and holes when a reverse bias is applied to the semiconductor device according to the second embodiment.

As shown in FIG. 14A, in a state where a forward bias is applied to the vertical DMOSFET, current If flows from the side of the source electrode 79 to the side of the drain region 71. At this time, in the vertical DMOSFET, holes 46 flow from the first body region 73 and the second body region 74 which the source electrode 79 joins to the drift region 72. At the same time, electrons 47 flow from the side of the drain region 71 to the drift region 72.

At this time, in the terminal region 20, the second body region 74 and the third body region 75 are in an electrically separated state from each other. Because of this, even if current flows from the side of the source electrode 79 to the side of the drain region 71, holes 46 do not flow from the third body region 75 to the drift region 72.

Accordingly, the number of holes 46 that are injected into the drift region 72 when a forward bias is applied can be reduced.

As shown in FIG. 14B, in a state where a reverse bias is applied to the vertical DMOSFET, reverse current flows from the side of the drain region 71 to the side of the source electrode 79. In the vertical DMOSFET, the reverse bias is rapidly applied before the holes 46, which are minority carriers and flow into the drift region 72, are recombined with the electrons 47, which are majority carriers, to vanish. Because of this, the holes 46, which are minority carriers that remain in the drift region 72 without being recombined, are drawn by the negative (−) potential of the source electrode 79 to which the reverse potential is applied.

As described above, since a small number of holes 46 are injected into the drift region 72 when a forward bias is applied, it becomes possible to shorten the time for which the holes 46 in the drift region 72 are drawn out when the forward bias is applied. Accordingly, complete depletion of the drift region 72 is facilitated, and reduction of trr and Irp becomes possible.

Further, in the terminal region of the vertical DMOSFET, the depletion layer is expanded from the second body region 74 to the drift region 72 when the reverse bias is applied. In the vertical DMOSFET, the length of the gap 60 between the second body region 74 and the third body region 75 is set to be equal to or shorter than the length of the depletion layer that spreads from the second body region 74 to the drift region 72. Because of this, when the reverse bias is applied to the vertical DMOSFET, punch-through 63 due to the depletion is formed in the gap 60, and the second body region 74 and the third body region 75 are electrically connected.

As described above, when the reverse bias is applied to the vertical DMOSFET, the area of the p-type semiconductor region (body region) on the surface of the drift region 72 of the vertical region 20 can be increased through the electrical connection between the second body region 74 and the third body region 75. Through this, the breakdown voltage of the semiconductor device can be improved.

Further, the configuration, in which the punch-through 63 is formed in the gap 60 when the reverse bias is applied and the p-type semiconductor region of the terminal region 20 is electrically connected, may operate in the same manner as the semiconductor device according to the second embodiment as described above. Accordingly, the semiconductor device according to the first embodiment and the semiconductor device according to the modified example 3 of the second embodiment operate in the same manner as the semiconductor device according to the second embodiment.

[Operation 2: Channel Region]

In the terminal region 20, the operation of the semiconductor device in which a channel region is formed just below the gate electrode or the field electrode will be described as an example of the semiconductor device according to the modified example 1 of the second embodiment as described above.

Figure 15A:
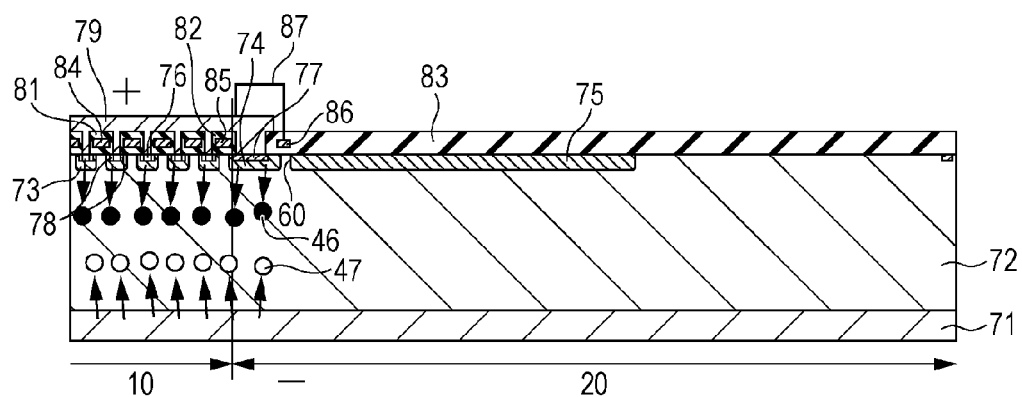
FIGS. 15A and 15B are views showing movement of electrons and holes in the semiconductor device according to the modified example 1 of the second embodiment.
Figure 15B:
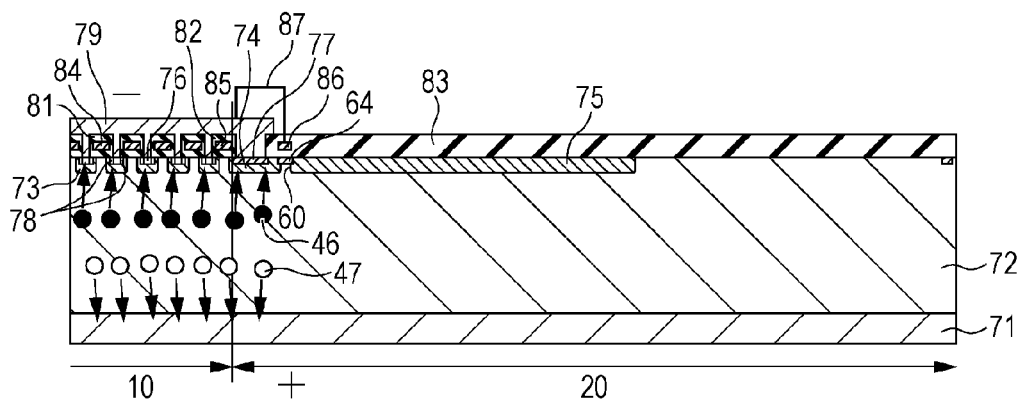

Movement of electrons and holes of the semiconductor device according to the modified example 1 of the second embodiment in the output stage circuit of the boost converter is shown in FIGS. 15A and 15B. FIG. 15A is a view showing the movement of electrons and holes when a forward bias is applied to the semiconductor device according to the modified example 1 of the second embodiment, and FIG. 15B is a view showing the movement of electrons and holes when a reverse bias is applied to the semiconductor device according to the modified example 1 of the second embodiment.

As shown in FIG. 15A, in a state where a forward bias is applied to the vertical DMOSFET, current If flows from the side of the source electrode 79 to the side of the drain region 71. At this time, the horizontal MOSFET, which is composed of the third gate electrode 86, the second body region 74, the third body region 75, and the drift region 72 of the gap 60, is in a turned-off state. Because of this, a channel region is not formed in the gap 60 between the second body region 74 and the third body region 75. Accordingly, when the forward bias is applied to the vertical DMOSFET, the second body region 74 and the third body region 75 are in an electrically separated state from each other.

As a result, in the vertical DMOSFET, holes 46 flow from the first body region 73 and the second body region 74, which the source electrode 79 joins, to the drift region 72. At the same time, electrons 47 flow from the side of the drain region 71 to the drift region 72. However, in the terminal region 20, the second body region 74 and the third body region 75 are in an electrically separated state from each other. Because of this, even if current flows from the side of the source electrode 79 to the side of the drain region 71, holes 46 do not flow from the third body region 75 to the drift region 72.

Accordingly, the number of holes 46 that are injected into the drift region 72 when a forward bias is applied can be reduced.

In a state where a reverse bias is applied to the vertical DMOSFET, reverse current flows from the side of the drain region 71 to the side of the source electrode 79. In the vertical DMOSFET, the reverse bias is rapidly applied before the holes 46, which are minority carriers and flow into the drift region 72, are recombined with the electrons 47, which are majority carriers, to vanish. Because of this, the holes 46, which are minority carriers that remain in the drift region 72 without being recombined, are drawn by the negative potential of the source electrode 79 to which the reverse potential is applied.

As described above, since a small number of holes 46 are injected into the drift region 72 when a forward bias is applied, it becomes possible to shorten the time for which the holes 46 in the drift region 72 are drawn out when the reverse bias is applied. Accordingly, complete depletion of the drift region 72 is facilitated, and reduction of trr and Irp becomes possible.

Further, as illustrated in FIG. 15B, the third gate electrode 86 on the gap 60 is connected to the source electrode 79, and the first potential extraction region 76 and the second potential extraction region 77 interlock with each other. Accordingly, when a reverse bias is applied to the vertical DMOSFET, the horizontal MOSFET, which is composed of the third gate electrode 86, the second body region 74, the third body region 75, and the drift region 72 of the gap 60 in the terminal region 20, is in a turned-on state. Further, a channel region 64 is formed just below the third gate electrode 86, that is, on the drift region 72 of the gap 60 between the second body region 74 and the third body region 75, and the second body region 74 and the third body region 75 are electrically connected.

As described above, when the reverse bias is applied to the vertical DMOSFET, the area of the p-type semiconductor region (body region) on the surface of the drift region 72 of the vertical region 20 can be increased through the electrical connection between the second body region 74 and the third body region 75. Through this, the breakdown voltage of the semiconductor device can be improved.

Further, the configuration, in which the channel region 64 is formed in the gap 60 when the reverse bias is applied and the p-type semiconductor region of the terminal region 20 is electrically connected, may operate in the same manner as the semiconductor device according to the modified example 1 of the second embodiment as described above. Accordingly, the semiconductor device according to the modified example 1 of the first embodiment and the semiconductor device according to the modified example 2 of the second embodiment operate in the same manner as the semiconductor device according to the modified example 1 of the second embodiment.

Further, although in the above-described semiconductor device, it is described that the first conduction-type is an n-type and the second conduction-type is a p-type, the conduction-types, that is, the n-type and p-type, may be oppositely determined in the present disclosure.

Further, the present disclosure may take the following configurations.

(1) A semiconductor device including a first conduction-type semiconductor substrate; a first semiconductor region of a first conduction-type formed on the semiconductor substrate; a second semiconductor region of a second conduction-type formed on a surface of the first semiconductor region; a third semiconductor region of the second conduction-type formed to be separated from the second semiconductor region on the surface of the first semiconductor region; a fourth semiconductor region of the second conduction-type formed to be separated from the second semiconductor region and the third semiconductor region on the surface of the first semiconductor region; and a first electrode connected to the second semiconductor region and the third semiconductor region.

(2) The semiconductor device as described in (1), wherein the third semiconductor region and the fourth semiconductor region are electrically connected by potential propagation through a depletion layer that reaches from an end portion of the third semiconductor region of the first semiconductor region to an end portion of the fourth semiconductor region when a reverse voltage is applied to the first electrode.

(3) The semiconductor device as described in (1) or (2), wherein the second semiconductor region is formed in an active region, and the third semiconductor region and the fourth semiconductor region are formed in a terminal region.

(4) The semiconductor device as described in any one of (1) to (3), further including an insulating layer formed on the third semiconductor region and the fourth semiconductor region in the first semiconductor region; a second electrode which extends over portions of the third semiconductor region and the fourth semiconductor region in the insulating layer and is formed on the first semiconductor region through the insulating layer; and a wire connecting the first electrode and the second electrode to each other.

(5) The semiconductor device as described in any one of (1) to (4), further including a fifth semiconductor region of the second conduction-type formed on the surface of the second semiconductor region in the second semiconductor region, and a sixth semiconductor region of the second conduction-type formed on the surface of the third semiconductor region in the third semiconductor region.

(6) The semiconductor device as described in any one of (1) to (5), further including a first gate electrode formed on the first semiconductor region through a first gate insulating film so as to extend over portions of the neighboring second semiconductor regions; and a second gate electrode formed on the first semiconductor region through a second gate insulating film so that the second gate electrode extends over portions of the second semiconductor region and the third semiconductor region.

(7) The semiconductor device as described in (6), further including a third gate insulating film formed on the third semiconductor region and the fourth semiconductor region in the first semiconductor region; a third gate electrode which extends over portions of the third semiconductor region and the fourth semiconductor region and is formed on the first semiconductor region through the third gate insulating film; and a gate wire connecting the first electrode and the third gate electrode to each other.

(8) The semiconductor device as described in (6) or (7), further including a second conduction-type pillar region periodically arranged in the second semiconductor region, the third semiconductor region and the fourth semiconductor region in a direction that is parallel to the main surface of the semiconductor substrate in the first semiconductor region.

(9) The semiconductor device as described in any one of (6) to (8), wherein a seventh semiconductor region of the first conduction-type is formed on the surface of the second semiconductor region and a fifth semiconductor region is formed at both ends of the seventh semiconductor region in the second semiconductor region.

The present disclosure contains subject matter related to that disclosed in Japanese Priority Patent Application JP 2011-071044 filed in the Japan Patent Office on Mar. 28, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A semiconductor device comprising:
a first conduction-type semiconductor substrate divided along one direction into a terminal region and an active region, the active region for active elements;
a first semiconductor region of a first conduction-type formed on the semiconductor substrate;
a second semiconductor region of a second conduction-type formed on a surface of the first semiconductor region and within the active region;
a third semiconductor region of the second conduction-type formed separated from the second semiconductor region on the surface of the first semiconductor region and within the terminal region but adjacent active region;
a fourth semiconductor region of the second conduction-type formed separated from both the second semiconductor region and the third semiconductor region on the surface of the first semiconductor region and within the terminal region; and
a first electrode connected to the second semiconductor region and the third semiconductor region,
wherein,
the third semiconductor region is between the second and fourth semiconductor regions, the fourth semiconductor region is separated from the third semiconductor region by a continuous gap between said third and fourth semiconductor regions, and the length of the gap in the one direction is equal to or shorter than a distance of a depletion layer that forms from a side of the third semiconductor region to a side of the fourth semiconductor region when a reverse voltage is applied to the first electrode.

2. The semiconductor device according to claim 1, wherein the third semiconductor region and the fourth semiconductor region are electrically connected by potential propagation through a depletion layer that reaches from an end portion of the third semiconductor region to an end portion of the fourth semiconductor region in the gap when a reverse voltage is applied to the first electrode.

3. The semiconductor device according to claim 1, further comprising:
an insulating layer formed on the third semiconductor region and the fourth semiconductor region, the first electrode being connected to the third semiconductor region through the insulating layer;
a second electrode in the insulating layer and over the gap; and
a wire connecting the first electrode and the second electrode to each other.

4. The semiconductor device according to claim 1, further comprising a fifth semiconductor region of the second conduction-type formed on the surface of the second semiconductor region, and a sixth semiconductor region of the second conduction-type formed on the surface of the third semiconductor region, the fifth and sixth semiconductor regions being between the first electrode and the second and third semiconductor regions, respectively.

5. The semiconductor device according to claim 1, further comprising:
a first gate electrode formed on the first semiconductor region through a first gate insulating film so as to extend over portions of the neighboring second semiconductor region; and
a second gate electrode formed on the first semiconductor region through a second gate insulating film so that the second gate electrode extends over portions of the second semiconductor region and the third semiconductor region.

6. The semiconductor device according to claim 5, further comprising:
a third gate insulating film formed on the third semiconductor region and the fourth semiconductor region in the first semiconductor region;
a third gate electrode which extends over portions of the third semiconductor region and the fourth semiconductor region and is formed on the first semiconductor region through the third gate insulating film; and
a gate wire connecting the first electrode and the third gate electrode to each other.

7. The semiconductor device according to claim 5, further comprising a second conduction-type pillar region periodically arranged in the second semiconductor region, the third semiconductor region and the fourth semiconductor region in a direction that is parallel to the main surface of the semiconductor substrate in the first semiconductor region.

8. The semiconductor device according to claim 5, wherein a seventh semiconductor region of the first conduction-type is formed on the surface of the second semiconductor region and a fifth semiconductor region is formed at both ends of the seventh semiconductor region in the second semiconductor region.

\* \* \* \* \*